United States Patent
Xiong et al.

(10) Patent No.: US 10,593,370 B1
(45) Date of Patent: Mar. 17, 2020

(54) REDUCING VIBRATION OF DATA STORAGE DEVICE IN A DATA STORAGE SYSTEM

(71) Applicant: Western Digital Technologies, Inc., San Jose, CA (US)

(72) Inventors: Shaomin Xiong, Fremont, CA (US); Toshiki Hirano, San Jose, CA (US); Satoshi Yamamoto, San Jose, CA (US); Jeff Wilke, Palmer Lake, CO (US); Dave Niss, Boulder, CO (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/182,447

(22) Filed: Nov. 6, 2018

(51) Int. Cl.
- *G11B 33/08* (2006.01)
- *G11B 33/12* (2006.01)
- *H05K 7/20* (2006.01)

(52) U.S. Cl.
CPC ............ *G11B 33/08* (2013.01); *G11B 33/125* (2013.01); *H05K 7/20172* (2013.01)

(58) Field of Classification Search
CPC .............................. G11B 33/08; G11B 33/125
USPC ...................... 360/97.13, 97.19; 361/679.34
See application file for complete search history.

(56) References Cited

U.S. PATENT DOCUMENTS

| | | |
|---|---|---|
| 4,807,718 A | 2/1989 | Lotz |
| 4,926,291 A | 5/1990 | Sarraf |
| 5,596,483 A | 1/1997 | Wyler |
| 5,781,373 A | 7/1998 | Larson et al. |
| 5,890,959 A | 4/1999 | Pettit et al. |
| 6,343,984 B1 | 2/2002 | Langdon et al. |
| 6,646,876 B2 | 11/2003 | Carr et al. |
| 6,954,329 B1 | 10/2005 | Ojeda et al. |
| 6,958,884 B1 | 10/2005 | Ojeda et al. |
| 7,715,188 B2 | 5/2010 | Matsushima et al. |
| 7,894,613 B1 | 2/2011 | Ong et al. |
| 7,965,503 B2 | 6/2011 | Yoder et al. |
| 8,165,311 B2 | 4/2012 | Rodrigues et al. |
| 8,845,299 B1 | 9/2014 | Hughes |
| 2002/0051338 A1 | 5/2002 | Jiang et al. |
| 2007/0240308 A1 | 10/2007 | Hutchinson et al. |

(Continued)

FOREIGN PATENT DOCUMENTS

JP 2004-4229 A * 1/2004

OTHER PUBLICATIONS

Unknown, HDD Fan Control, downloaded at http://www.hddfancontrol.com on Jun. 30, 2015, 4 pages.

(Continued)

*Primary Examiner* — Jefferson A Evans
(74) *Attorney, Agent, or Firm* — John D. Henkhaus

(57) ABSTRACT

A data storage system may include multiple data storage devices, such as hard disk drives, a cooling fan, and a sound balancer structure between the fan and the drives. The sound balancer is intentionally positioned where it substantially balances, about the center of rotation of and along at least one axis of a fan-facing storage device, the sound pressure from the fan that impinges upon the fan-facing face of the storage device. This redistribution of the sound pressure suppresses sound pressure-induced torque upon and therefore rotational vibration of the storage device, which in turn enhances the track following capability of the storage device.

20 Claims, 8 Drawing Sheets

(56) References Cited

U.S. PATENT DOCUMENTS

| | | | |
|---|---|---|---|
| 2009/0195922 A1* | 8/2009 | Urmanov | G11B 25/043 360/97.19 |
| 2010/0002890 A1* | 1/2010 | Lyon | G10K 11/178 381/71.5 |
| 2010/0103615 A1* | 4/2010 | Yoder | G11B 33/12 361/692 |
| 2011/0175007 A1 | 7/2011 | Sato et al. | |
| 2011/0255705 A1* | 10/2011 | Ozeki | G10K 11/178 381/71.3 |
| 2013/0037620 A1* | 2/2013 | Aryanfar | G06F 1/20 236/49.3 |
| 2014/0098487 A1 | 4/2014 | Hartman et al. | |
| 2016/0298653 A1* | 10/2016 | Masuo | F04D 29/668 |
| 2017/0160771 A1* | 6/2017 | Albrecht | G06F 1/206 |
| 2017/0218978 A1 | 8/2017 | Amin-Shahidi et al. | |
| 2017/0221526 A1* | 8/2017 | Albrecht | G06F 1/182 |
| 2018/0090181 A1* | 3/2018 | Paterra | G11B 33/1486 |

OTHER PUBLICATIONS

International Search Report and Written Opinion for counterpart PCT/US2019/046241, dated Dec. 2, 2019, 11 pages, KIPO ISA/KR.

* cited by examiner

POSITION A SOUND BALANCER STRUCTURE BETWEEN A COOLING FAN AND A DATA STORAGE DEVICE WHERE THE SOUND BALANCER SUBSTANTIALLY BALANCES, IN AT LEAST ONE DIRECTION ABOUT THE CENTER OF MASS OF THE DATA STORAGE DEVICE, SOUND PRESSURE IMPARTED UPON THE DATA STORAGE DEVICE FROM THE COOLING FAN, WHEREIN POSITIONING THE SOUND BALANCER MAY COMPRISE SLIDING THE SOUND BALANCER ALONG A SLIDE MECHANISM TO A POSITION THAT SUBSTANTIALLY MINIMIZES A POSITION ERROR SIGNAL (PES) COMPONENT ATTRIBUTABLE TO ROTATIONAL VIBRATION OF THE DATA STORAGE DEVICE
602

FIX THE SOUND BALANCER TO THE SLIDE MECHANISM AT THE POSITION
604

FIG. 6

REDUCING VIBRATION OF DATA STORAGE DEVICE IN A DATA STORAGE SYSTEM

FIELD OF EMBODIMENTS

Embodiments of the invention may relate generally to data storage systems, and particularly to reducing vibration of the storage devices constituent to data storage systems.

BACKGROUND

A hard disk drive (HDD) is a non-volatile storage device that is housed in a protective enclosure and stores digitally encoded data on one or more circular disks having magnetic surfaces. When an HDD is in operation, each magnetic-recording disk is rapidly rotated by a spindle system. Data is read from and written to a magnetic-recording disk using a read-write head that is positioned over a specific location of a disk by an actuator. A read-write head makes use of magnetic fields to write data to, and read data from the surface of a magnetic-recording disk. A write head works by using the current flowing through its coil to produce a magnetic field. Electrical pulses are sent to the write head, with different patterns of positive and negative currents. The current in the coil of the write head produces a localized magnetic field across the gap between the head and the magnetic disk, which in turn magnetizes a small area on the recording medium.

There is a commercial demand for high-capacity digital data storage systems, in which multiple data storage devices (DSDs) are housed in a common enclosure. A DSD, such as an HDD, may undergo rigid body rotation in response to any number of environmental vibration sources, especially in a multi-HDD storage system. Such rotation may be the result of, for example, airflow and acoustic energy from system fans, mechanical coupling among neighbor HDDs, other external disturbances transmitted through a common system motherboard and/or electrical connectors, and the like. In order to compensate for read-write head off-track issues due to HDD rotational vibration that is transmitted to the read-write head, such as from the HDD enclosure base, rotational vibration (RV) feed-forward systems are implemented into some HDDs. However, as HDD data tracks become narrower and narrower and system environments in which HDDs are installed generate more and more vibrational energy within the system (e.g., because of increased HDD density within the system, and system motherboard temperature demands, which require higher RPM fan usage), the frequency range of the vibration (and thus the energy) experienced by the HDDs is rising (e.g., above 2 kHz) and classical approaches to compensating for the effects of rotational vibration may no longer be effective enough.

Any approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

Embodiments are illustrated by way of example, and not by way of limitation, in the figures of the accompanying drawings and in which like reference numerals refer to similar elements and in which:

FIG. 6 is a flow diagram illustrating a method of suppressing rotational vibration of a data storage device housed within a data storage system enclosure, according to an embodiment.

DETAILED DESCRIPTION

Generally, approaches to managing vibration affecting data storage devices within a data storage system are described. In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices are shown in block diagram form in order to avoid unnecessarily obscuring the embodiments of the invention described herein.

Physical Description of an Illustrative Operating Context

Embodiments may be used in the context of a digital data storage device (DSD), such as a hard disk drive (HDD). Thus, in accordance with an embodiment, a plan view illustrating an HDD 100 is shown in FIG. 1 to illustrate an exemplary operating context.

Figure 1:
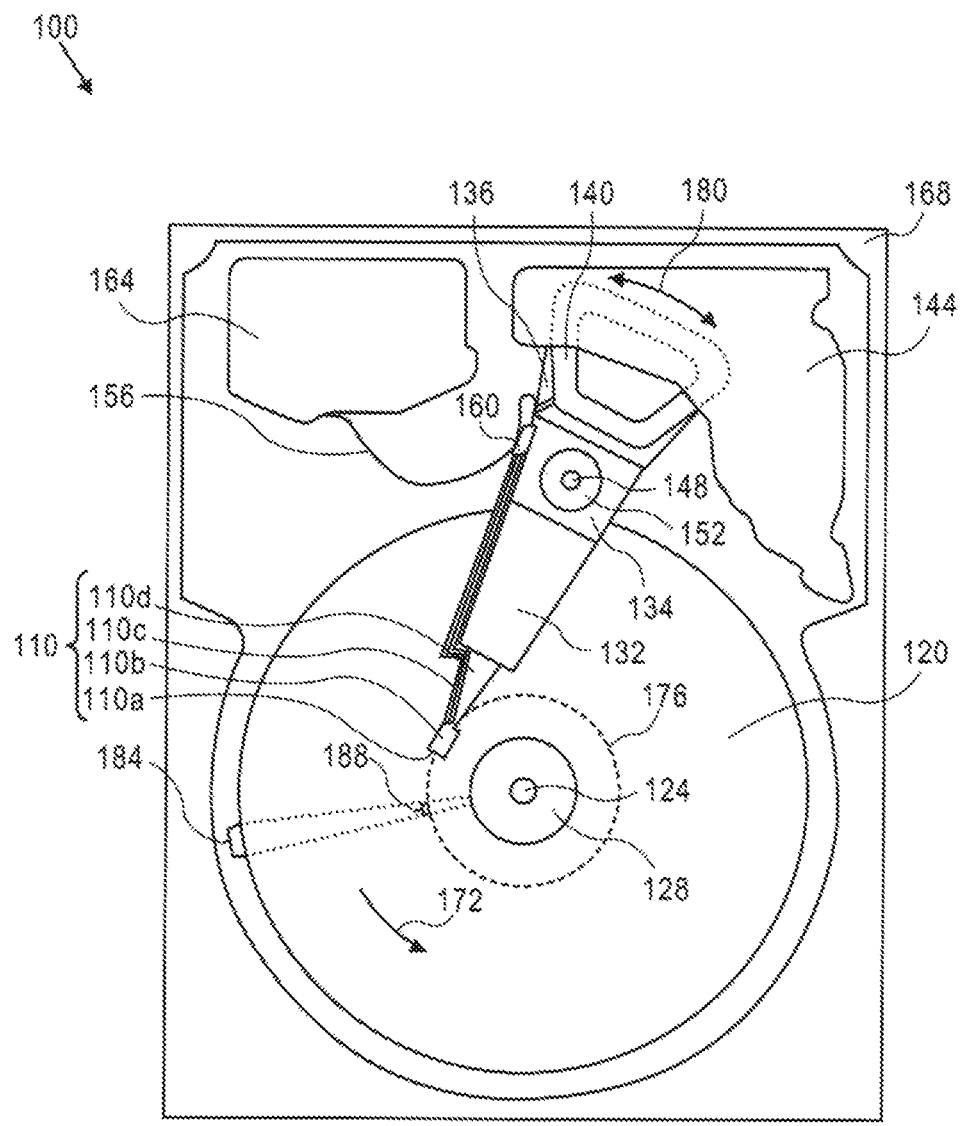
FIG. 1 is a plan view illustrating a hard disk drive (HDD), according to an embodiment.

FIG. 1 illustrates the functional arrangement of components of the HDD 100 including a slider 110*b* that includes a magnetic read-write head 110*a*. Collectively, slider 110*b* and head 110*a* may be referred to as a head slider. The HDD 100 includes at least one head gimbal assembly (HGA) 110 including the head slider, a lead suspension 110*c* attached to the head slider typically via a flexure, and a load beam 110*d* attached to the lead suspension 110*c*. The HDD 100 also includes at least one recording medium 120 rotatably mounted on a spindle 124 and a drive motor (not visible) attached to the spindle 124 for rotating the medium 120. The read-write head 110*a*, which may also be referred to as a transducer, includes a write element and a read element for respectively writing and reading information stored on the medium 120 of the HDD 100. The medium 120 or a plurality of disk media may be affixed to the spindle 124 with a disk clamp 128.

The HDD 100 further includes an arm 132 attached to the HGA 110, a carriage 134, a voice-coil motor (VCM) that includes an armature 136 including a voice coil 140 attached to the carriage 134 and a stator 144 including a voice-coil magnet (not visible). The armature 136 of the VCM is attached to the carriage 134 and is configured to move the arm 132 and the HGA 110 to access portions of the medium 120, all collectively mounted on a pivot shaft 148 with an interposed pivot bearing assembly 152. In the case of an HDD having multiple disks, the carriage 134 may be referred to as an "E-block," or comb, because the carriage is arranged to carry a ganged array of arms that gives it the appearance of a comb.

An assembly comprising a head gimbal assembly (e.g., HGA 110) including a flexure to which the head slider is coupled, an actuator arm (e.g., arm 132) and/or load beam to which the flexure is coupled, and an actuator (e.g., the VCM) to which the actuator arm is coupled, may be collectively referred to as a head stack assembly (HSA). An HSA may, however, include more or fewer components than those described. For example, an HSA may refer to an assembly that further includes electrical interconnection components. Generally, an HSA is the assembly configured to move the head slider to access portions of the medium 120 for read and write operations.

With further reference to FIG. 1, electrical signals (e.g., current to the voice coil 140 of the VCM) comprising a write signal to and a read signal from the head 110a, are transmitted by a flexible cable assembly (FCA) 156 (or "flex cable"). Interconnection between the flex cable 156 and the head 110a may include an arm-electronics (AE) module 160, which may have an on-board pre-amplifier for the read signal, as well as other read-channel and write-channel electronic components. The AE module 160 may be attached to the carriage 134 as shown. The flex cable 156 may be coupled to an electrical-connector block 164, which provides electrical communication, in some configurations, through an electrical feed-through provided by an HDD housing 168. The HDD housing 168 (or "enclosure base" or "baseplate" or simply "base"), in conjunction with an HDD cover, provides a semi-sealed (or hermetically sealed, in some configurations) protective enclosure for the information storage components of the HDD 100.

Other electronic components, including a disk controller and servo electronics including a digital-signal processor (DSP), provide electrical signals to the drive motor, the voice coil 140 of the VCM and the head 110a of the HGA 110. The electrical signal provided to the drive motor enables the drive motor to spin providing a torque to the spindle 124 which is in turn transmitted to the medium 120 that is affixed to the spindle 124. As a result, the medium 120 spins in a direction 172. The spinning medium 120 creates a cushion of air that acts as an air-bearing on which the air-bearing surface (ABS) of the slider 110b rides so that the slider 110b flies above the surface of the medium 120 without making contact with a thin magnetic-recording layer in which information is recorded. Similarly in an HDD in which a lighter-than-air gas is utilized, such as helium for a non-limiting example, the spinning medium 120 creates a cushion of gas that acts as a gas or fluid bearing on which the slider 110b rides.

The electrical signal provided to the voice coil 140 of the VCM enables the head 110a of the HGA 110 to access a track 176 on which information is recorded. Thus, the armature 136 of the VCM swings through an arc 180, which enables the head 110a of the HGA 110 to access various tracks on the medium 120. Information is stored on the medium 120 in a plurality of radially nested tracks arranged in sectors on the medium 120, such as sector 184. Correspondingly, each track is composed of a plurality of sectored track portions (or "track sector") such as sectored track portion 188. Each sectored track portion 188 may include recorded information, and a header containing error correction code information and a servo-burst-signal pattern, such as an ABCD-servo-burst-signal pattern, which is information that identifies the track 176. In accessing the track 176, the read element of the head 110a of the HGA 110 reads the servo-burst-signal pattern, which provides a position-error-signal (PES) to the servo electronics, which controls the electrical signal provided to the voice coil 140 of the VCM, thereby enabling the head 110a to follow the track 176. Upon finding the track 176 and identifying a particular sectored track portion 188, the head 110a either reads information from the track 176 or writes information to the track 176 depending on instructions received by the disk controller from an external agent, for example, a microprocessor of a computer system.

An HDD's electronic architecture comprises numerous electronic components for performing their respective functions for operation of an HDD, such as a hard disk controller ("HDC"), an interface controller, an arm electronics module, a data channel, a motor driver, a servo processor, buffer memory, etc. Two or more of such components may be combined on a single integrated circuit board referred to as a "system on a chip" ("SOC"). Several, if not all, of such electronic components are typically arranged on a printed circuit board that is coupled to the bottom side of an HDD, such as to HDD housing 168.

References herein to a hard disk drive, such as HDD 100 illustrated and described in reference to FIG. 1, may encompass an information storage device that is at times referred to as a "hybrid drive". A hybrid drive refers generally to a storage device having functionality of both a traditional HDD (see, e.g., HDD 100) combined with solid-state storage device (SSD) using non-volatile memory, such as flash or other solid-state (e.g., integrated circuits) memory, which is electrically erasable and programmable. As operation, management and control of the different types of storage media typically differ, the solid-state portion of a hybrid drive may include its own corresponding controller functionality, which may be integrated into a single controller along with the HDD functionality. A hybrid drive may be architected and configured to operate and to utilize the solid-state portion in a number of ways, such as, for non-limiting examples, by using the solid-state memory as cache memory, for storing frequently-accessed data, for storing I/O intensive data, and the like. Further, a hybrid drive may be architected and configured essentially as two storage devices in a single enclosure, i.e., a traditional HDD and an SSD, with either one or multiple interfaces for host connection.

Introduction

The term "substantially" will be understood to describe a feature that is largely or nearly structured, configured, dimensioned, etc., but with which manufacturing tolerances and the like may in practice result in a situation in which the structure, configuration, dimension, etc. is not always or necessarily precisely as stated. For example, describing a structure as "substantially vertical" would assign that term its plain meaning, such that the sidewall is vertical for all practical purposes but may not be precisely at 90 degrees.

While terms such as "optimal", "optimize", "minimal", "minimize", and the like may not have certain values associated therewith, if such terms are used herein the intent is that one of ordinary skill in the art would understand such terms to include affecting a value, parameter, metric, and the like in a beneficial direction consistent with the totality of this disclosure. For example, describing a value of something as "minimal" does not require that the value actually be equal to some theoretical minimum (e.g., zero), but should be understood in a practical sense in that a corresponding goal would be to move the value in a beneficial direction toward a theoretical minimum.

Figure 2:
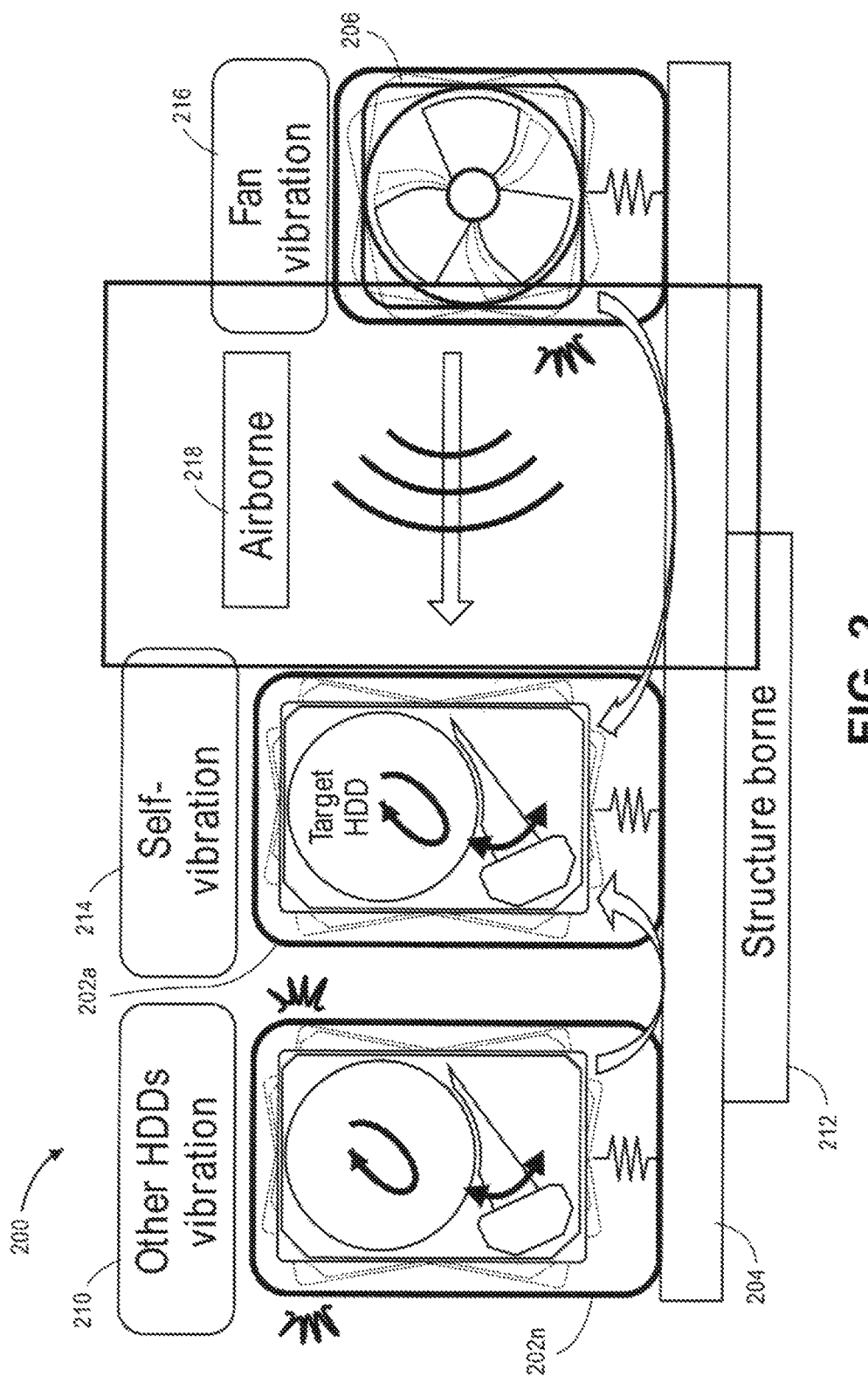
FIG. 2 is a side view schematic diagram illustrating sources and transmission of vibration within a data storage system.

FIG. 2 is a side view schematic diagram illustrating sources and transmission of vibration within a data storage system. Recall that in a high-capacity digital data storage system such as system 200, in which multiple data storage devices (DSDs) 202a-202n are housed in a common enclosure and may share a common chassis 204 (where n represents a number that may vary from implementation to implementation), a DSD 202a-202n such as an HDD may undergo rigid body rotation and modes of vibration in response to any number of environmental vibration sources. Such HDD rotational vibration (RV) that is transmitted to the read-write head of a given HDD has a deleterious effect on the performance of the HDD, as well as on the performance of the larger storage system 200.

As illustrated in FIG. 2, there are multiple sources of vibration of a data storage device, such as DSD 202a, within a data storage system such as data storage system 200. Such vibration may be the result of, for example, mechanical coupling 210 among neighbor HDDs, structure borne disturbances 212 transmitted for example through a common system motherboard and/or electrical connectors and/or chassis 204 and/or from vibration 216 of a system fan(s) 206, self-vibration 214 from the rotating parts within the HDD, and airborne disturbances 218 such as airflow and acoustic energy from the system fan(s) 206.

Studies have shown that sound (airborne) disturbance 218 is a dominating disturbance source in some data storage systems. Such sound disturbances are generated primarily from the system fan(s) 206 and, if left unchecked, typically lead to rotational vibration of the DSD 202a. This, in turn, can have a non-trivial negative effect on device performance, as track following is very sensitive to RV. For example, track following (such as measured by a position error signal, or "PES") has a direct effect on the read/write speed (I/O per second, or "IOPS"). Hence, reducing RV (and/or other modes of vibration, generally) of a DSD 202a such as an HDD can improve the PES and IOPS associated with the DSD 202a. Possible approaches to improving PES by suppressing RV and other modes of vibration may include implementing a stealth cooling fan, and/or shifting the frequency generated by the cooling fan, and/or implementing sound absorber material in the path between the cooling fan and the DSD.

Sound Balancing to Reduce Vibration

According to embodiments, a sound barrier/balancer mechanism is properly positioned between the system cooling fan(s), such as fan 206 (FIG. 2), and the data storage device of interest, such as DSD 202a (FIG. 2), to redistribute (e.g., effectively "balance") the sound pressure, thereby reducing the vibration associated with the DSD. This technique is generally referred to herein as "sound balancing".

Figure 3A:
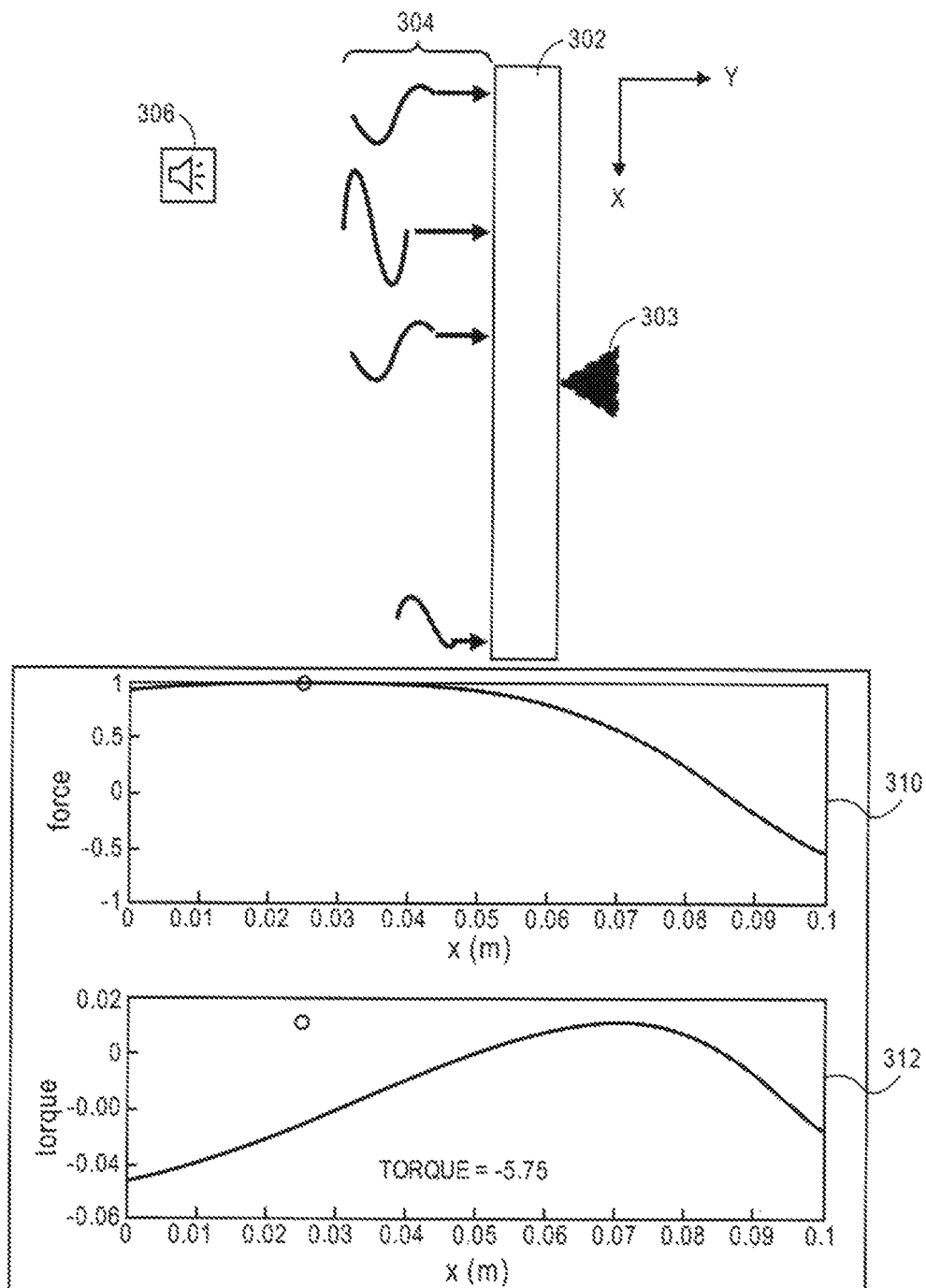
FIG. 3A is a schematic diagram illustrating sound pressure-induced torque on a rigid body without sound balancing.

FIG. 3A is a schematic diagram illustrating sound pressure-induced torque on a rigid body without sound balancing. The upper portion of FIG. 3A illustrates a simplified model of a rigid body 302 having a center of rotation 303 (or, center of mass) in the x-direction, and the sound pressure 304 (also, "acoustic force") generated by a sound source 306 such as a system cooling fan(s) 206 (FIG. 2). The lower portion of FIG. 3A illustrates two example graphs. The top graph 310 illustrates the acoustic force 304 applied to the rigid body 302, along the x-direction, from the sound source 306. The sound pressure from the sound source 306 generates the acoustic force 304 on the rigid body 302, which could lead to linear motion of the rigid body 302. The bottom graph 312 illustrates the torque, along the x-direction, corresponding to the acoustic force 304 (of graph 310). The sound pressure from the sound source 306 generates torque on the rigid body 302, which could lead to rotational vibration of the rigid body 302, which would depend on the distribution of the sound pressure about its center of rotation 303. For a non-limiting arbitrary example, the total torque applied to the rigid body 302 along the x-axis may be −5.75 (no unit specified), which characterizes a relatively unbalanced sound pressure distribution impinging upon or applied to the rigid body 302. This applied torque, in turn, would cause the rigid body 302 to rotate/vibrate about its center of rotation 303. Thus, in order to inhibit RV (in a particular plane) caused by the applied sound pressure, a goal would be to move the absolute value of the sound pressure-induced torque to or toward zero, i.e., toward a "perfectly" balanced sound pressure profile (about the center of rotation in a particular direction), impinging upon the DSD enclosure of interest. For example, balancing the sound pressure 304 about the center of rotation 303 along the x-direction of the rigid body 302 would suppress RV in the x-y plane.

Figure 3B:
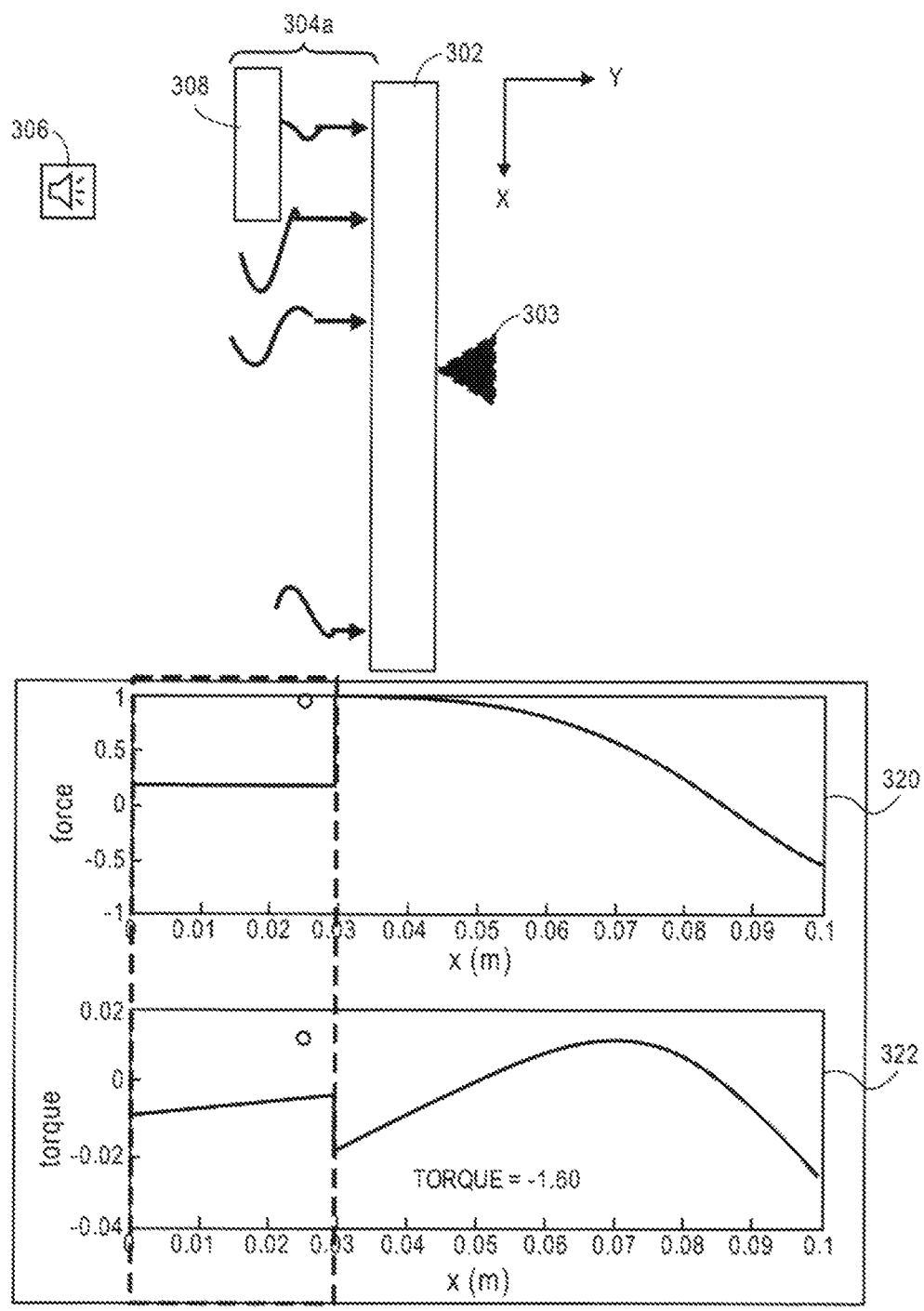
FIG. 3B is a schematic diagram illustrating sound pressure-induced torque on a rigid body with sound balancing, according to an embodiment.

FIG. 3B is a schematic diagram illustrating sound pressure-induced torque on a rigid body with sound balancing, according to an embodiment. Similarly to FIG. 3A, the upper portion of FIG. 3B illustrates a simplified model of a rigid body 302 having a center of rotation 303 (or, center of mass) in the x-direction, and the sound pressure 304a (also, "acoustic force") generated by a sound source 306 such as a system cooling fan(s) 206 (FIG. 2). However, the model of FIG. 3B differs from the model of FIG. 3A in that the model of FIG. 3B includes a sound balancer mechanism 308 or structure (or simply "sound balancer") positioned between the sound source 306 and the rigid body 302, whereby the sound balancer 308 is positioned in the x-direction where it redistributes and substantially balances the sound pressure 304a impinging upon the rigid body 302. The lower portion of FIG. 3B illustrates two example graphs. The top graph 320 illustrates the acoustic force 304a applied to the rigid body 302, along the x-direction, from the sound source 306, with the sound balancer 308 in place. The bottom graph 322 illustrates the torque, along the x-direction, corresponding to the acoustic force 304a (of graph 320). The sound pressure from the sound source 306 generates the torque on the rigid body 302, which could lead to excessive and undesirable rotational vibration of the rigid body 302 about its center of rotation 303, but for the redistribution of the sound pressure effectuated by the presence and positioning of the sound balancer 308. For a non-limiting arbitrary example, the total torque applied to the rigid body 302 along the x-axis may be −1.60 (no unit specified), which characterizes a relatively balanced sound pressure distribution impinging upon or applied to the rigid body 302, as compared to the model of FIG. 3A. Note that in the area in the x-direction of the sound balancer 308, the force is reduced in graph 320 from graph 310 and the torque is reduced in graph 322 from graph 312. Thus, this reduction in applied torque caused by the sound pressure positively affects (i.e., reduces, suppresses) the likelihood of inducing RV onto the rigid body 302. Again, in order to inhibit RV (in a particular plane) caused by the applied sound pressure, a goal would be to move the absolute value of the sound pressure-induced torque to or toward zero, i.e., toward a "perfectly" balanced sound pressure profile (about the center of rotation in a particular direction), impinging upon the DSD enclosure of interest. That is, a more uniform sound pressure distribution across the DSD face is more effective at reducing the RV than a ramp/step distribution of the sound pressure. Balancing the sound pressure as described may also affect, and therefore may be tuned for, minimizing the excitation of other mechanical resonance modes of vibration.

Figure 3C:
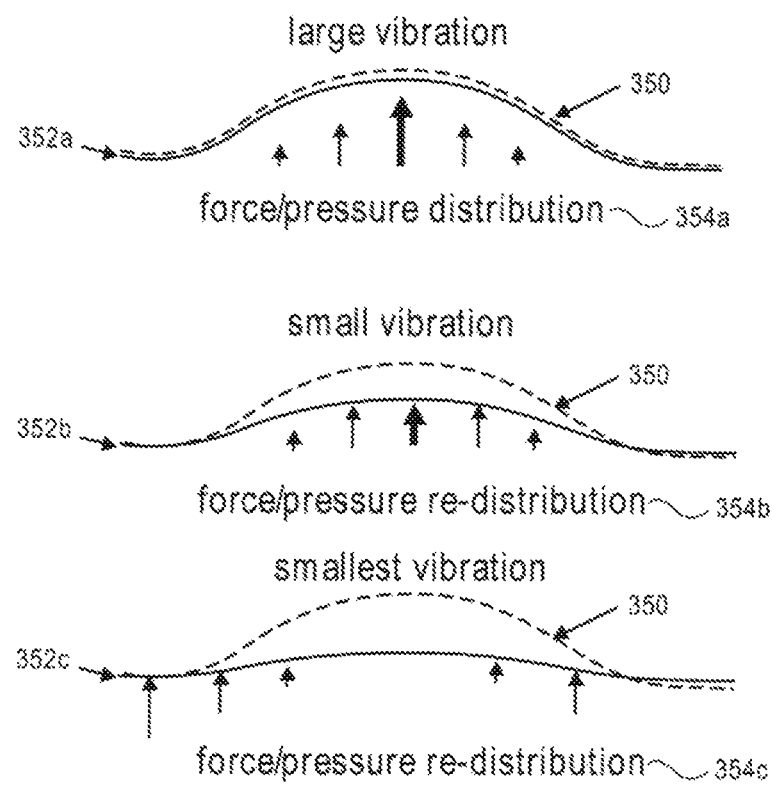
FIG. 3C is a schematic diagram illustrating sound pressure-induced vibration relative to a structural modal shape, according to an embodiment.

FIG. 3C is a schematic diagram illustrating sound pressure-induced vibration relative to a structural modal shape, according to an embodiment. FIG. 3C is composed of three diagrams that each illustrate, simply and for exemplary purposes, the modal shape of a structure (such as an HDD), which remains the same across all three diagrams, and the effective vibration on the structure that is induced by a force/pressure distribution applied to the structure, such as the acoustic force/sound pressure distribution (or simply "pressure distribution") from a cooling fan as described elsewhere herein.

The uppermost diagram of FIG. 3C illustrates (by dashed line) the modal shape 350 corresponding to the structure, where the modal shape 350 represents the fundamental manner in which the exemplary structure vibrates in response to excitation (e.g., amplitude across the "length" or other dimension of the structure), generally, and the vibration line 352a represents how the exemplary structure would vibrate in response to excitation from the corresponding pressure distribution 354a (again, the amplitude across the same dimension of the structure). In this example, the modal shape 350 shows that the exemplary structure fundamentally vibrates or perhaps resonates with the greatest amplitude near the center of the structure. Similarly, the middle diagram of FIG. 3C again illustrates the modal shape 350 corresponding to the structure, and the vibration line 352b represents how the exemplary structure would vibrate in response to excitation from the corresponding pressure distribution 354b. This middle diagram shows that redistributing the pressure distribution 354b, e.g., by lowering the pressure around the middle of the structure where its modal shape 350 is highest, would lead to a lesser vibrational impact on the structure. Furthermore, the lowermost diagram of FIG. 3C again illustrates the modal shape 350 corresponding to the structure, and the vibration line 352c represents how the exemplary structure would vibrate in response to excitation from the corresponding pressure distribution 354c. This lowermost diagram shows that redistributing the pressure distribution 354c, e.g., by further lowering or eliminating the pressure around the middle of the structure where its modal shape 350 is highest, would lead to an even lesser vibrational impact on the structure than would the pressure distribution 354b of the middle diagram.

Taken collectively, the diagrams of FIG. 3C illustrate that when the applied pressure distribution matches with the modal shape of the exemplary structure, the vibration of the structure is greater, and likewise that the vibration of the structure can be lessened by redistributing the applied pressure distribution to lessen the pressure distribution at the highest area(s) of the modal shape. Stated otherwise, if the applied pressure to the exemplary structure at the area(s) where the modal amplitude is the largest is reduced, then the vibration is consequently reduced. Hence, in addition to affecting the rotational vibration of a structure/system as described in reference to FIG. 3B, for example, the judicious placement of a sound pressure redistribution mechanism (e.g., sound balancer 306 of FIG. 3B) may also be utilized to beneficially affect or reduce other modes of vibration corresponding to a given structure/system, such as a DSD (e.g., DSD 202a of FIG. 2) in a data storage system Sound Balancer Slider Implementation FIG. 4A is a side view schematic diagram illustrating a data storage system sled, according to embodiments. FIG. 4A illustrates a possible configuration for a data storage system sled 400, comprising a plurality of hard disk drives (HDDs) 402a-402n (where n represents a number that may vary from implementation to implementation) mounted in an enclosure 401, a cooling fan 406, and a sound balancer 408 interposed between the cooling fan 406 and the HDDs 402a-402n. In this configuration, the HDDs 402a-402n are positioned such that a long side (or face) faces the cooling fan 406, rather than the top, bottom, or a short side of a typically rectangular component. Thus, each HDD 402a-402n long side comprises a long axis (in the x-direction) and a short axis (in the z-direction, i.e., into the page). However, the positioning and mounting of the HDDs within a sled is not limited to as illustrated and, therefore, may vary from implementation to implementation. According to an embodiment, the HDD 402a closest to the fan 406 is of primary interest with respect to balancing the sound pressure thereon. In particular, with this configuration illustrated in FIG. 4A, and with subsequent non-limiting examples, the sound pressure impinging generally perpendicular to the long side/face is of primary interest, such that the placement of the sound balancer 408 is intended to suppress rotational vibration about the center of rotation along the x-direction, in the x-y plane. However, in which plane the RV may be suppressed may vary from implementation to implementation, including along multiple directions in multiple planes.

Because the precise positioning of the sound balancer 408 directly and significantly affects the sound pressure-induced torque and thus its effect on the RV and PES of the HDD 402a, it may be preferable to "tune" and set the sound balancer 408 position after the sled 400 (or the complete data storage system assembly) is finally assembled. With that in mind, an approach to positioning the sound balancer 408 within any particular data storage system may involve (a) measuring the vertical (x-direction) sound pressure distribution in front of the first row HDD (e.g., HDD 402a) with the cooling fan 406 turned on; (b) measuring the PES of the HDD; (c) positioning a sound balancer 408 structure in front of the HDD at the location of maximum sound pressure, as measured at (a); (d) again measuring the PES; (e) fine-tuning the location of the sound balancer 408 structure vertically to obtain a minimum average PES value; and (f) fixing the location of the sound balancer 408 where the minimum average PES was reached. Regarding the consideration of the location of the sound balancer 408, the center of mass and mass distribution of the relevant HDD in one or more directions, the structural dynamics of the relevant HDD, the operational parameters of the relevant HDD, the cooling fan location, and the like, may affect and therefore are worthy concerns when determining a location for fixing the sound balancer 408. For this "position tuning" technique, a variably positionable sound balancer 408 is preferable. According to an embodiment, the sound balancer 408 is movably mounted or attached to a slide mechanism 410, such as a pair of rails on which the sound balancer 408 may be slidingly moved.

Figure 4B:
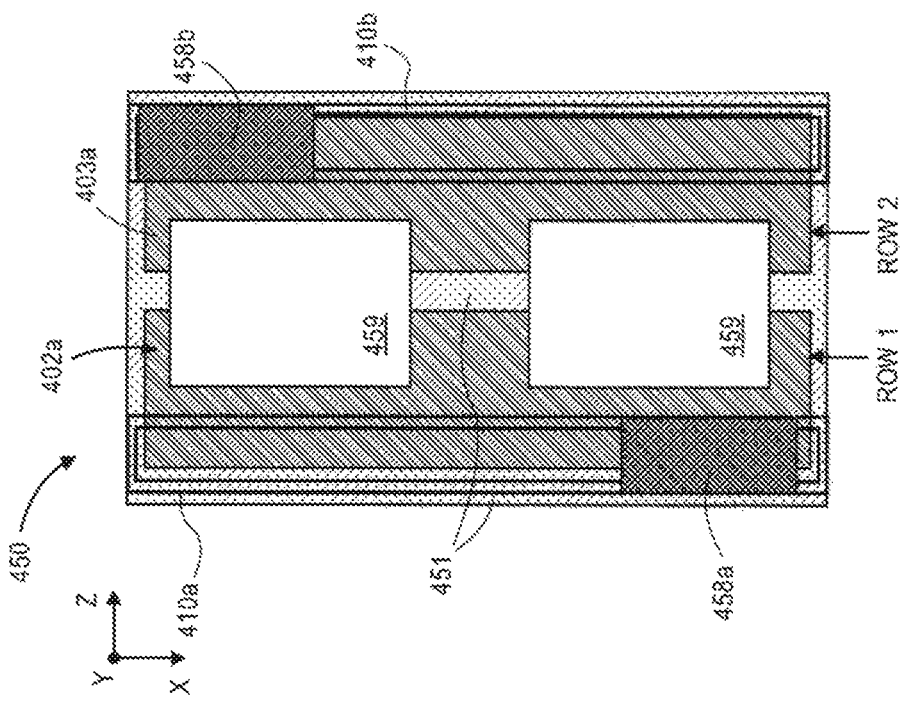
FIG. 4B is a front view schematic diagram illustrating a data storage system sled, according to an embodiment.
Figure 4A:
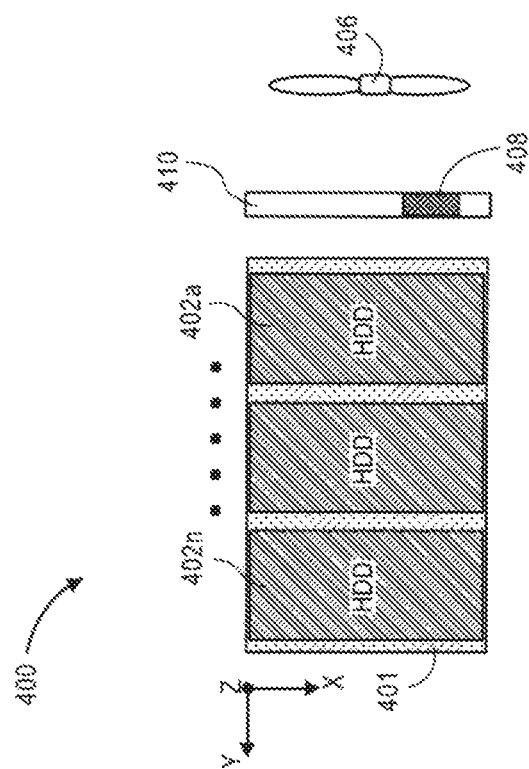
FIG. 4A is a side view schematic diagram illustrating a data storage system sled, according to an embodiment.

FIG. 4B is a front view schematic diagram illustrating a data storage system sled, according to embodiments. FIG. 4B illustrates a possible configuration for a data storage system sled 450, comprising multiple rows (two shown, row 1 shown comprising 402a and row 2 shown comprising 403a) of hard disk drives (HDDs) each comprising a plurality of HDDs (e.g., HDDs 402a-402n of FIG. 4A) mounted in an enclosure 451, and a respective sound balancer 458a, 458b movably mounted or attached to a respective slide mechanism 410a, 410b, such as a pair of rails on which each sound balancer 458a, 458b may be slidingly moved. In this configuration, the visible HDDs 402a, 403a are positioned similarly to as in FIG. 4A, such that a long side faces a cooling fan such as the cooling fan 406 (FIG. 4A). However, the positioning and mounting of the HDDs within a sled is not limited to as illustrated and, therefore, may vary from implementation to implementation. According to an embodiment, the HDDs 402a, 403a closest to the fan are of primary interest with respect to balancing the sound pressure thereon. In particular, with this configuration illustrated in FIG. 4B, the sound pressure impinging upon the long side (front facing) is of primary interest, such that the placement of each sound balancer 458a, 458b is intended to suppress rotational vibration about the center of rotation along the x-direction, in the x-y plane. However, in which plane the RV may be suppressed may vary from implementation to implementation, including along multiple directions in multiple planes.

Note that the positioning of each sound balancer 458a, 458b as illustrated in FIG. 4B is for example purposes. Because the precise positioning of each sound balancer 458a, 458b directly and significantly affects the sound pressure-induced torque and thus its effect on the RV and PES of the HDDs 402a, 403a, it may be preferable to "tune" and set each sound balancer 458a, 458b position after the sled 450 (or the complete data storage system assembly) is finally assembled. With that in mind, an approach to positioning the sound balancers 458a, 458b within any particular data storage system may involve the same or similar "position tuning" technique described in reference to FIG. 4A.

The view of FIG. 4B further illustrates an example of a plurality of airflow openings 459 (two shown), the number, shape, and placement of which may vary from implementation to implementation. The airflow openings 459 are openings in the structure of the enclosure 451 so that air generated from the cooling fan 406 can flow through to the racks of HDDs. Thus, a preferable implementation of sound balancer(s) as described herein would minimally or negligibly impede such airflow to the devices.

Figure 5:
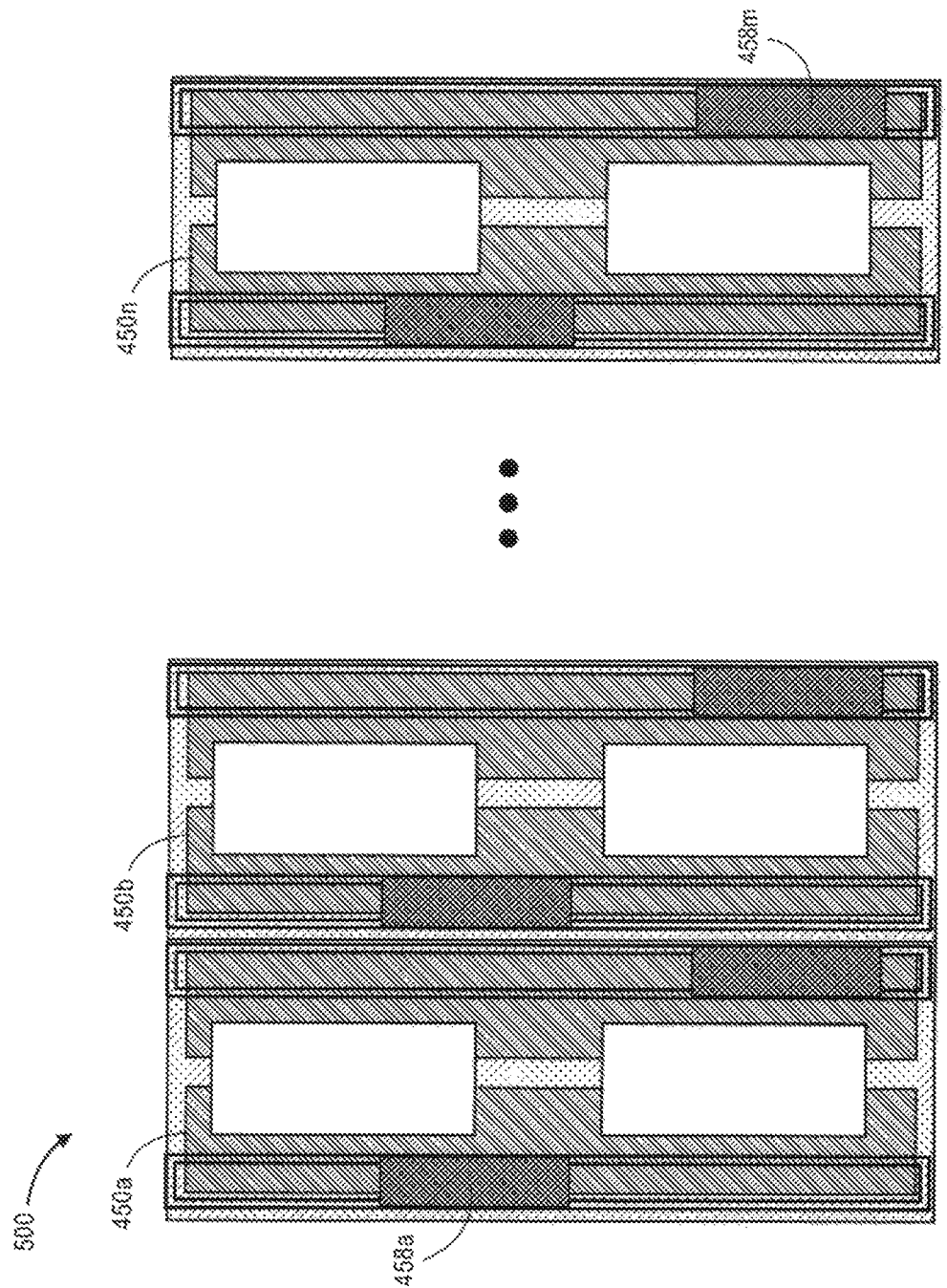
FIG. 5 is a front view schematic diagram illustrating a data storage system, according to an embodiment.

FIG. 5 is a front view schematic diagram illustrating a data storage system, according to an embodiment. Data storage system 500 (or "rack 500") comprises a plurality of sleds 450a, 450b-450n similar to sled 450 of FIG. 4B, where n represents a number that may vary from implementation to implementation. While the position of each of the respective sound balancers 458a-458m on each side of a respective sled 450-450n is illustrated as being the same position, the actual position of each sound balancer 458a-458m may vary from implementation to implementation, whereby the position of each is adjusted and fixed for each respective front facing HDD to minimize each corresponding PES, which can take into account rotational and/or other modes of vibration.

Sound Balancer Implementations

While the precise configuration of a sound balancer such as any of sound balancers 408 (FIG. 4A), 458a, 458b (FIG. 4B), 458a-458m (FIG. 5) may vary from implementation to implementation, some guidelines are described as follows. As discussed above, the position of each sound balancer is key, as well as the shape and size. Regarding the shape, a rectangular shaped sound balancer has been shown to be effective (e.g., a simple rectangular plate), with a general goal of redistributing the sound pressure from the fan (e.g., cooling fan 406 of FIG. 4A) while not blocking enclosure airflow openings (e.g., airflow openings 459 of FIG. 5). While an elliptical shape may be effective, a circular shape with a sufficient diameter/vertical span for sound redistribution purposes could be too wide in the horizontal direction, thus blocking at least a portion of airflow opening(s).

Regarding the size of a sound balancer, its thickness is preferably thin (e.g., a couple millimeters thick has shown to be effective), to conform to typical space constraints within a data storage system, while being rigid enough to serve the purpose of redistributing the sound pressure, i.e., a foil may be too thin for optimum performance as intended. While any solid material may be effective (e.g., a metal or plastic), a foam-type material is not considered attenuating enough and would need to be considerably thicker than a more rigid solid material, thereby possibly violating space constraints within the data storage system. Regarding the dimension of a sound balancer in the long axis direction of the device for which the sound balancer is intended to affect, according to an embodiment, the height of a sound balancer in the direction of such long axis is in a range of 10%-50% of the height of the enclosure, such as enclosure 451 (FIG. 4B). Regarding the dimension of a sound balancer in the short axis direction of the device for which the sound balancer is intended to affect (e.g., a typical HDD is approximately 2-3 centimeters wide), according to an embodiment, the width of a sound balancer in the direction of such short axis is less than 50% of the width of the enclosure, such as enclosure 451 (FIG. 4B).

Method for Suppressing Rotational Vibration of a Data Storage Device

FIG. 6 is a flow diagram illustrating a method of suppressing rotational vibration of a data storage device housed within a data storage system enclosure, according to an embodiment. For example, the method of FIG. 6 could be employed in a data storage system sled or rack, such as those illustrated and described in reference to FIGS. 4A, 4B, and 5.

At block 602, a sound balancer structure is positioned between a cooling fan and a data storage device (DSD) where the sound balancer substantially balances, in at least one direction about the center of mass of the DSD, sound pressure imparted upon the DSD from the cooling fan, wherein positioning the sound balancer may comprise sliding the sound balancer along a slide mechanism to a position that substantially minimizes a position error signal (PES) component attributable to rotational vibration of the DSD.

At block 604, the sound balancer is fixed to the slide mechanism at the position of block 602.

Extensions and Alternatives

In the foregoing description, embodiments of the invention have been described with reference to numerous specific details that may vary from implementation to implementation. Therefore, various modifications and changes may be made thereto without departing from the broader spirit and scope of the embodiments. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

In addition, in this description certain process steps may be set forth in a particular order, and alphabetic and alphanumeric labels may be used to identify certain steps. Unless specifically stated in the description, embodiments are not necessarily limited to any particular order of carrying out such steps. In particular, the labels are used merely for convenient identification of steps, and are not intended to specify or require a particular order of carrying out such steps.

What is claimed is:

1. A data storage system comprising:
    a cooling fan configured to generate sound pressure in a direction toward a plurality of data storage devices;
    the plurality of data storage devices, wherein:
        at least one data storage device of the plurality of data storage devices comprises a face located closest to the fan, and
        the face has a long axis and a short axis perpendicular to the long axis; and
    a variably-positionable sound balancer mechanism located between the fan and the plurality of data storage devices and which is attached to a mounting mechanism at one of a plurality of mount locations along the length of the mounting mechanism, wherein the sound balancer is specifically positioned where the sound balancer substantially balances the particular sound pressure impinging upon the at least one data storage device as configured particular to the data storage system while allowing a non-negligible amount of airflow from the cooling fan to reach the at least one data storage device, about the center of mass and along at least one of the long axis and the short axis.

2. The data storage system of claim 1, wherein the sound balancer being specifically positioned where it substantially balances the particular sound pressure about the center of mass along at least one of the long and short axes inhibits rotational vibration of the at least one data storage device.

3. The data storage system of claim 2, wherein the sound balancer is specifically positioned to inhibit rotational vibration of the at least one data storage device by decreasing the absolute value of the particular sound pressure-induced torque about the center of mass along at least one of the long and short axes.

4. The data storage system of claim 1, wherein the sound balancer is specifically positioned where it balances the particular sound pressure along the long axis of the face of the at least one data storage device so that the sound balancer inhibits rotation of the at least one data storage device about the short axis.

5. The data storage system of claim 1, wherein the sound balancer comprises a substantially rectangular plate of material.

6. The data storage system of claim 1, wherein the mounting mechanism comprises:
    a slide mechanism, extending in a direction consistent with the long axis of the face of the at least one data storage device, to which the sound balancer is movably attached.

7. The data storage system of claim 1, wherein:
    at least two data storage devices of the plurality of data storage devices each comprises a face located closest to the fan;
    each face of each data storage device of the at least two data storage devices has a long axis and a short axis perpendicular to the long axis; and
    the data storage system further comprises:
        a first slide mechanism, extending in a direction consistent with the long axis of the face of a first data storage device of the at least two data storage devices, to which a first variably-positionable sound balancer is movably attached to the first slide mechanism at one of a plurality of mount locations along the length of the first slide mechanism for specific positioning where the first sound balancer substantially balances the particular sound pressure-induced torque applied to the first data storage device as configured particular to the data storage system while allowing a non-negligible amount of airflow from the cooling fan to reach the first data storage device, about the center of mass and along the long axis of the face of the first data storage device; and
        a second slide mechanism, extending in a direction consistent with the long axis of the face of a second data storage device of the at least two data storage devices, to which a second variably-positionable sound balancer is movably attached to the second slide mechanism at one of a plurality of mount locations along the length of the second slide mechanism for specific positioning where the second sound balancer substantially balances the particular sound pressure-induced torque applied to the second data storage device as configured particular to the data storage system while allowing a non-negligible amount of airflow from the cooling fan to reach the second data storage device, about the center of mass and along the long axis of the face of the second data storage device.

8. The data storage system of claim 1, wherein:
    each of the plurality of data storage devices is housed in an enclosure; and
    the height of the sound balancer in the direction of the long axis is in a range of 10-50% of the height of the enclosure.

9. The data storage system of claim 8, wherein the width of the sound balancer in the direction of the short axis is less than 50% of the width of the enclosure.

10. A method of suppressing rotational vibration of a data storage device housed within a data storage system enclosure, the method comprising:
    positioning a variably-positionable sound balancer structure between a cooling fan and the data storage device, wherein the sound balancer is specifically positioned at one of a plurality of mount locations along the length of a mounting mechanism to substantially balance, in at least one direction about the center of mass of the data storage device as configured particular to the data storage system, particular sound pressure imparted upon the data storage device from the cooling fan while allowing a non-negligible amount of airflow from the cooling fan to reach the data storage device.

11. The method of claim 10, wherein:
    the data storage device comprises a face located closest to the fan;
    the face has a long axis and a short axis perpendicular to the long axis; and positioning the sound balancer comprises specifically positioning where the sound balancer substantially balances the particular sound pressure along the long axis direction of the face so that the sound balancer inhibits rotation of the data storage device about the short axis by decreasing the absolute value of the sound pressure-induced torque about the center of mass along the long axis.

12. The method of claim 10, wherein:
the sound balancer comprises a substantially rectangular plate of material.

13. The method of claim 10, wherein:
the data storage device comprises a face located closest to the fan;
the face has a long axis and a short axis perpendicular to the long axis;
the sound balancer is movably attached to a slide mechanism extending in a direction consistent with the long axis; and
positioning the sound balancer comprises:
    sliding the sound balancer along the slide mechanism to a position corresponding to the one of the plurality of mount locations that substantially minimizes a position error signal (PES) component attributable to rotational vibration of the data storage device; and
    fixing the sound balancer to the slide mechanism at the position corresponding to the one of the plurality of mount locations.

14. The method of claim 10, wherein the variably-positionable sound balancer structure comprises a first sound balancer structure between the cooling fan and a first data storage device, the method further comprising:
positioning a second variably-positionable sound balancer structure between the cooling fan and a second data storage device, wherein the second sound balancer is specifically positioned at one of a plurality of mount locations along the length of a mounting mechanism to substantially balance, in at least one direction about the center of mass of the second data storage device as configured particular to the data storage system, particular sound pressure imparted upon the second data storage device from the cooling fan while allowing a non-negligible amount of airflow from the cooling fan to reach the second data storage device.

15. The method of claim 10, wherein:
the height of the sound balancer in the direction of a long axis of the data storage device is in a range of 10-50% of the height of the enclosure.

16. The method of claim 15, wherein the width of the sound balancer in the direction of a short axis of the data storage device is less than 50% of the width of the enclosure.

17. A data storage system comprising:
a plurality of data storage devices, wherein at least one data storage device of the plurality of data storage devices is positioned closest to a cooling fan; and
means for redistributing sound pressure from the cooling fan which is applied specifically to the particular at least one data storage device as configured particular to the data storage system, while allowing a non-negligible amount of airflow from the cooling fan to reach the at least one data storage device.

18. The data storage system of claim 17, wherein the means for redistributing includes means for substantially balancing the sound pressure about the center of mass along at least one axis of the particular at least one data storage device.

19. The data storage system of claim 18, wherein the means for redistributing includes means for decreasing the absolute value of sound pressure-induced torque from the cooling fan about the center of mass and along a long axis of the particular at least one data storage device.

20. The data storage system of claim 17, wherein the means for redistributing includes means for intentionally reducing the sound pressure amplitude applied at a particular location of the particular at least one data storage device.

* * * * *